US010211780B2

(12) United States Patent
Convert et al.

(10) Patent No.: US 10,211,780 B2
(45) Date of Patent: Feb. 19, 2019

(54) ALTERNATING ANTI-PARALLEL DIODE MIXER STRUCTURE (71) Applicant: MACOM Technology Solutions Holdings, Inc., Lowell, MA (US)

(72) Inventors: Emmanuelle R. O. Convert, Cammeray (AU); Simon J. Mahon, Avalon (AU); James T. Harvey, Rushcutters Bay (AU)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/402,445

(22) Filed: Jan. 10, 2017

(65) Prior Publication Data

US 2017/0237399 A1    Aug. 17, 2017

Related U.S. Application Data (63) Continuation-in-part of application No. 15/044,407, filed on Feb. 16, 2016, now Pat. No. 9,571,035.

(51) Int. Cl.
*H03D 7/14* (2006.01)
*H03H 7/21* (2006.01)
(Continued)

(52) U.S. Cl.
CPC ............. *H03D 7/1408* (2013.01); *H03D 7/02* (2013.01); *H03H 7/0115* (2013.01); *H03H 7/0161* (2013.01); *H03D 2200/0013* (2013.01)

(58) Field of Classification Search
CPC .. H03D 7/1458; H03D 7/1466; H03D 7/1475; H03D 7/1483; H03D 7/1491; H03H 7/0115; H02M 2/32
(Continued)

(56) References Cited

U.S. PATENT DOCUMENTS 3,983,489 A    9/1976  Gittinger .................. 455/331
4,955,079 A *  9/1990  Connerney .......... H03D 9/0641
                                                  455/325
(Continued)

FOREIGN PATENT DOCUMENTS

WO    WO99934505    *   8/1999

OTHER PUBLICATIONS

Hwann-Kaeo Chiou, et al., "A Miniature Q-Band Balanced Sub-Harmonically Pumped Image Rejection Mixer", IEEE Microwave and Wireless Components Letters, vol. 17, No. 6, Jun. 2007, pp. 463-465.
(Continued)

*Primary Examiner* — Dinh T Le
(74) *Attorney, Agent, or Firm* — Thomas | Horstemeyer, LLP; Michael J. D'Aurelio; Jason M. Perilla (57) ABSTRACT An apparatus includes a first circuit and a second circuit. The first circuit may have a first diode and a second diode connected as anti-parallel diodes and physically adjacent to each other in a substrate. The second circuit may have a third diode and a fourth diode connected as anti-parallel diodes and physically adjacent to each other in the substrate. The first circuit and the second circuit may be configured to mix two input signals to generate an output signal. A polarity of every other physically neighboring diode may be reversed.

18 Claims, 11 Drawing Sheets (51) Int. Cl.
  *H03H 7/01*  (2006.01)
  *H03D 7/02*  (2006.01)
(58) Field of Classification Search
  USPC .......................... 327/355–360; 455/323, 326
  See application file for complete search history.

(56) References Cited

U.S. PATENT DOCUMENTS

| | | | |
|---|---|---|---|
| 5,341,114 A * | 8/1994 | Calviello | H03G 11/025 |
| | | | 257/E27.012 |
| 7,167,698 B2 | 1/2007 | Katz | 333/125 |
| 2005/0191985 A1* | 9/2005 | Bos | H04B 1/0475 |
| | | | 455/326 |

OTHER PUBLICATIONS

Shuan-Ming Li, et al., "A 24GHz Sub-Harmonically Image Rejection Mixer with Various Asymmetrical Diode Pair", Microwave and Millimeter Wave Technology (ICMMT), 2010, International Conference on IEEE, pp. 521-524.

* cited by examiner

ALTERNATING ANTI-PARALLEL DIODE MIXER STRUCTURE

This application relates to U.S. Ser. No. 15/044,407, filed Feb. 16, 2016, which is incorporated by reference in its entirety.

FIELD OF THE INVENTION

The present invention relates to mixers generally and, more particularly, to a method and/or apparatus for implementing an alternating anti-parallel diode mixer structure.

BACKGROUND OF THE INVENTION

Reduction of radiated spurious signals is a criterion of modern communication receivers and transmitters, particularly in low and zero intermediate frequency architectures that facilitate decreased equipment costs. In such radios, a local oscillator leakage cannot be removed by radio frequency filters. A local oscillator to radio frequency isolation of a mixer used to shift the radio frequency to or from an intermediate frequency becomes important.

Regulatory bodies specify tight criteria for spurious radiation. A general specification for receivers by the European Committee for Standardization and Communications (ETSI) limits the leakage of local oscillator radiation to −55 decibel-milliwatts (dBm) to avoid interference to nearby receivers. The performance criterion of low and zero intermediate frequency receivers dictates even lower levels of spurious radiation. Radiated spectral mask specifications also impose a high local oscillator to radio frequency isolation in low and zero intermediate frequency transmitters.

Conventional mixers use a fundamental local oscillator signal to heterodyne the radio frequency to or from the intermediate frequency. The specified isolation of the high-level local oscillator is difficult to achieve due to a dependency on a balance of transformers. An alternative architecture is a sub-harmonic mixer that uses antiparallel diodes to implement a mixer where the high level local oscillator signal is an even sub-harmonic of the radio frequency.

It would be desirable to implement an alternating anti-parallel diode mixer structure.

SUMMARY OF THE INVENTION

The present invention concerns an apparatus that includes a first circuit and a second circuit. The first circuit may have a first diode and a second diode connected as anti-parallel diodes and physically adjacent to each other in a substrate. The second circuit may have a third diode and a fourth diode connected as anti-parallel diodes and physically adjacent to each other in the substrate. The first circuit and the second circuit may be configured to mix two input signals to generate an output signal. A polarity of every other physically neighboring diode may be reversed.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the present invention include providing an alternating anti-parallel diode mixer structure that may (i) provide better local oscillator signal leakage than common lumped anti-parallel designs, (ii) provide better local oscillator signal leakage than resistive-based designs, (iii) reduce the creation of local oscillator second harmonics, (iv) provide an improved thermal balance, (v) provide an improved radio frequency balance, (vi) implement frequency down conversions, (vii) implement frequency up conversions and/or (viii) be implemented in a single integrated circuit.

Various embodiments of the present invention may provide an anti-parallel diode mixer structure in which each alternating (every-other) diode finger has an opposite polarity than the diodes to either side. Each diode finger generally has a cathode connected to anodes of one or more immediately neighboring diodes and an anode connected to the cathodes of one or more immediately neighboring diodes in an anti-parallel diode arrangement. The alternating (or interdigitated) layout generally reduces a creation of local oscillator even harmonics that may be effective fundamental harmonics in a radio system sense. The anti-parallel diode structure may be sub-harmonically pumped to reduce or avoid creation of the local oscillator even harmonics.

The interdigitated layout of the diodes may be analogous to a 0101 . . . alternating sequence of binary bits. The zero-value bits may present the diodes having a particular layout in one direction. The one-value bits may present the diodes having a layout in the opposite direction. The alternating layout generally provides better radio frequency balance and thermal balance than common lumped diode layouts. The alternating layout may also reduce a fundamental local oscillator leakage for a core mixer cell (e.g., by up to 30 decibels (dB)).

The alternating anti-parallel diode structure may be implemented in mixers. The mixers may be used in frequency up-converters and/or infrequency down-converters. In up-converter mixers, an improved current drive of the mixers may reduce radio costs by enabling direct up conversion (heterodyne) architectures, also known as zero intermediate frequency architectures. Other applications of the frequency mixer may be implemented to meet the design criteria of a particular application.

Figure 1:
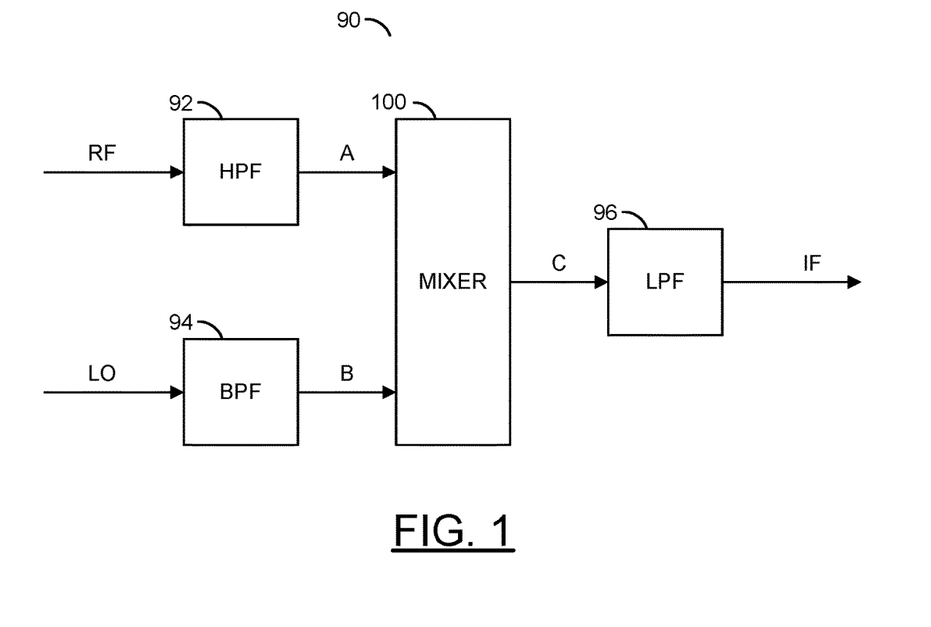
FIG. 1 is a block diagram of a converter circuit.

Referring to FIG. 1, a block diagram of an example implementation of a circuit 90 is shown. The circuit 90 may be operational as a down-converter circuit. The circuit 90 generally comprises a block (or circuit) 92, a block (or circuit) 94, a block (or circuit) 96 and a block (or circuit)

100. The circuits 92-100 may be implemented with hardware and/or simulated with software.

A signal (e.g., RF) may be received by the circuit 92. The signal RF may be a radio frequency signal received by the circuit 90. In various embodiments, the signal RF may reside within an extremely high frequency band (e.g., 30 gigahertz (GHz) to 300 GHz). The signal RF may be implemented in other frequency bands to meet the design criteria of a particular application.

The circuit 92 may generate a signal (e.g., A) transferred to the circuit 100. The signal A may represent a filtered version of the signal RF. A signal (e.g., LO) may be received by the circuit 94. The signal LO may be a local oscillator signal generated internally to the circuit 90. The circuit 94 may generate a signal (e.g., B) transferred to the circuit 100. The signal B may represent a filtered version of the signal LO. A signal (e.g., C) may be generated by the circuit 100 and conveyed to the circuit 96. The signal C may be implemented as an intermediate frequency signal. A frequency of the signal C may be based on the frequencies in the signals RF and LO. The circuit 96 may generate and present a signal (e.g., IF). The signal IF may be a filtered version of the signal C. In various embodiments, the signal RF may have a fundamental frequency higher than the signal LO. In some embodiments, the signal LO may have a higher fundamental frequency than the signal IF.

The circuit 92 is shown implemented as high-pass filter (HPF) circuit. The HPF circuit 92 is generally operational to high-pass filter the signal RF to create the signal A. A cut-off frequency of the HPF circuit 92 may allow fundamental and higher frequencies of the signal RF to pass with little to no attenuation and attenuate frequencies lower than the fundamental frequency of the signal RF.

The circuit 94 is shown implemented as a band-pass filter (BPF) circuit. The BPF circuit 92 is generally operational to band-pass filter the signal LO to create the signal B. The filter characteristics of the BPF circuit 94 may allow the fundamental frequency of the signal LO to pass through with little to no attenuation and attenuate frequencies above and below the fundamental frequency of the signal LO.

The circuit 96 is shown implemented as a low-pass filter (LPF) circuit. The LPF circuit 96 is generally operational to low-pass filter the signal C to create the signal IF. A cut-off frequency of the LPF circuit 96 may allow the fundamental and lower frequencies of the signal C to pass with little to no attenuation and attenuate frequencies higher than the fundamental frequency in the signal C. Other configurations of the filter circuits 92, 94 and/or 96 may be implemented to meet the design criteria of a particular application.

The circuit 100 is shown implemented as a mixer circuit. In various embodiments, the circuit 100 may be implemented as a sub-harmonic mixer circuit. The mixer circuit 100 is generally operational to mix the signals A and B to generate the signal C. In some embodiments, the mixing of the signals A and B may be achieved with anti-parallel diodes. The anti-parallel diodes may be fabricated on a semiconductor substrate in an alternating pattern where the cathodes and anodes of every other diode are oriented in opposing directions. In a down-conversion mode, the signal IF may be related to the signals RF and LO by equation 1 as follows:

$$IF=2\times N\times LO\pm M\times RF, \quad (1)$$

where N and M may be integers and the frequencies of the signals may have values such that IF<LO and IF<RF. Generally, the output signal IF may have a lower frequency than both of the two input signals RF and LO.

Figure 2:
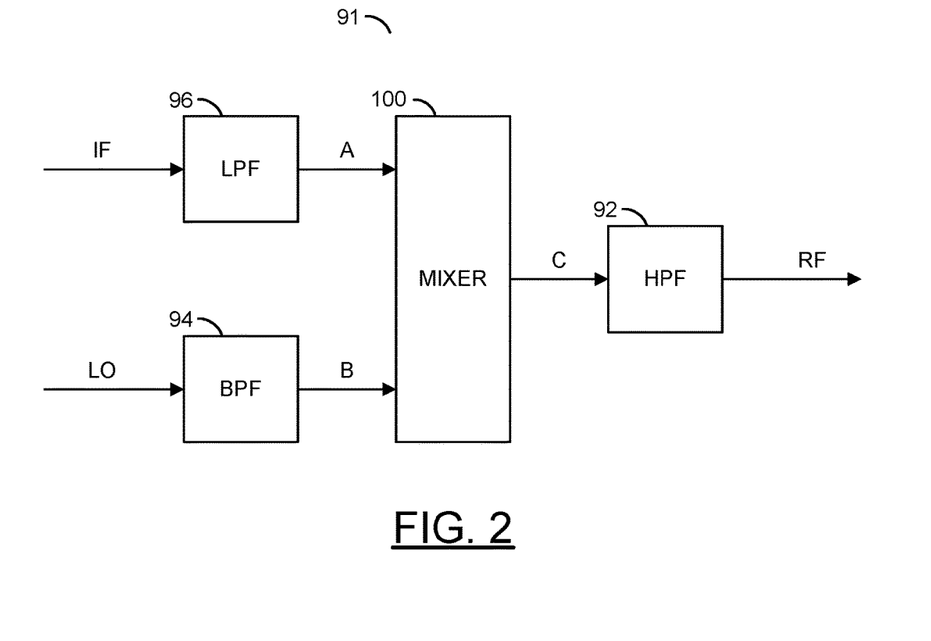
FIG. 2 is a block diagram of another converter circuit.

Referring to FIG. 2, a block diagram of an example implementation of a circuit 91 is shown. The circuit 91 may be operational as an up-converter circuit. The circuit 91 generally comprises the circuit 92, the circuit 94, the circuit 96 and the circuit 100. The circuit 92 may receive the signal C and generate the signal RF. The circuit 94 may receive the signal LO and generate the signal B. The circuit 96 may receive the signal IF and generate the signal A.

The HPF circuit 92 is generally operational to high-pass filter the signal C to create the signal RF. A cut-off frequency of the HPF circuit 92 may allow fundamental and higher frequencies of the signal C to pass with little to no attenuation and attenuate frequencies lower than the fundamental frequency of the signal C.

The BPF circuit 94 is generally operational to band-pass filter the signal LO to create the signal B. The filter characteristics of the BPF circuit 94 may allow the fundamental frequency of the signal LO to pass through with little to no attenuation and attenuate frequencies above and below the fundamental frequency of the signal LO.

The LPF circuit 96 is generally operational to low-pass filter the signal IF to create the signal A. A cut-off frequency of the LPF circuit 96 may allow the fundamental and lower frequencies of the signal IF to pass with little to no attenuation and attenuate frequencies higher than the fundamental frequency in the signal IF.

In an up-conversion mode, the circuit 100 may relate the signal RF to the signals IF and LO by equation 2 as follows:

$$RF=2\times N\times LO\pm M\times IF, \quad (2)$$

where N and M may be integers and the frequencies of the signals may have values such that IF<LO and IF<RF. Generally, the output signal RF may have a higher frequency than both of the two input signals IF and LO.

Figure 3:
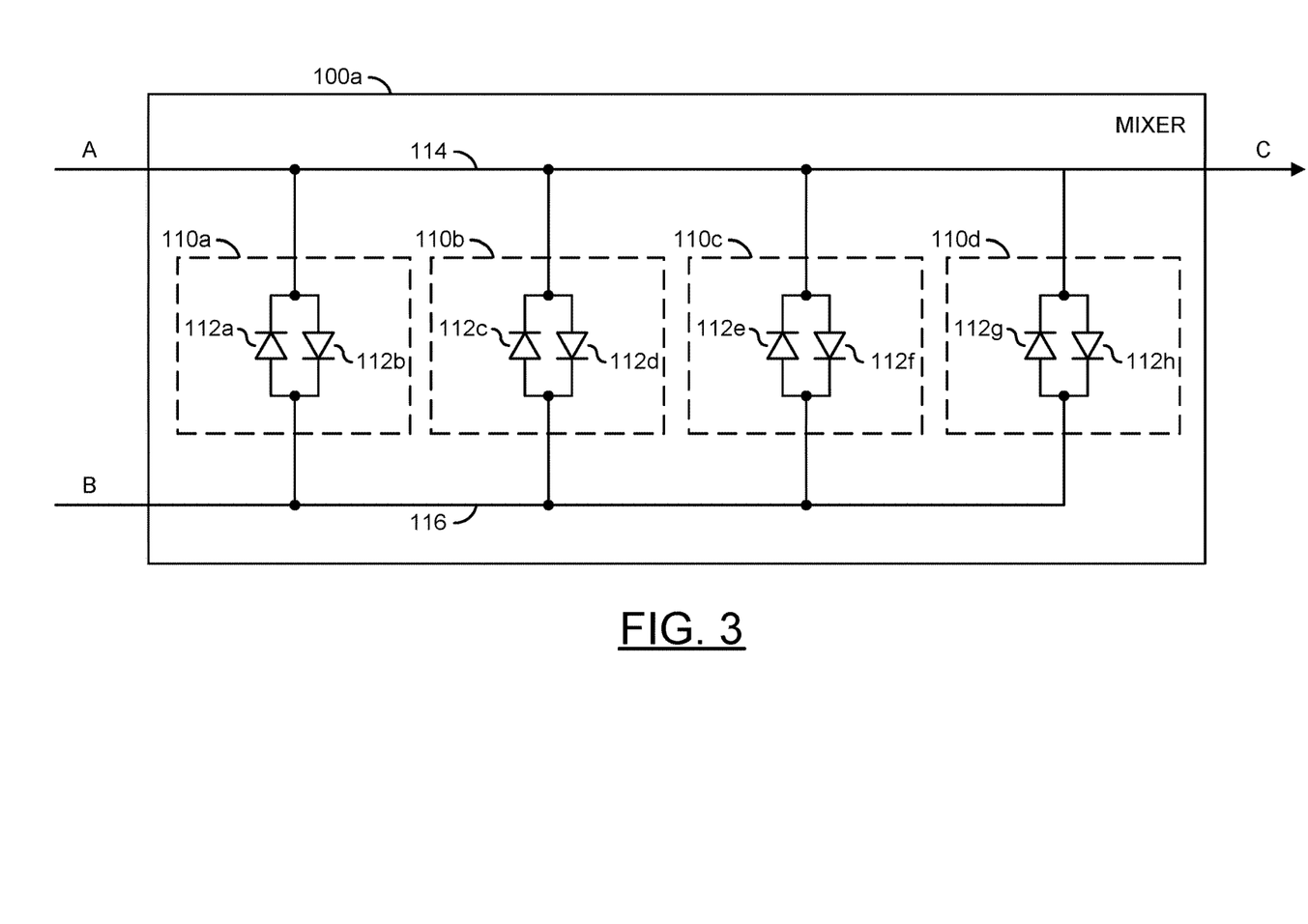
FIG. 3 is a block diagram of a series mixer circuit.

Referring to FIG. 3, a block diagram of an example implementation of a series mixer circuit 100a is shown. The mixer circuit 100 may be implemented with the series mixer circuit 100a. The circuit 100a generally comprises multiple blocks (or circuits) 110a-110d. The circuit 110a-110d generally comprises multiple blocks (or circuits) 112a-112h. Each circuit 110a-110d may include two of the circuits 112a-112h configured in an anti-parallel arrangement. A trace (or wire) 114 may connect an end of each circuit 110a-110d. A trace (or wire) 116 may connect another end of each circuit 110a-110d opposite the trace 114. The circuits 110a-116 may be implemented with hardware and/or simulated with software.

The signal A may be received on the trace 114. The signal B may be received on the trace 116. The signal C may be generated and presented from the trace 114. Each circuit 110a-110d may implement an anti-parallel diode circuit. Each circuit 112a-112h may be implemented as a diode. A series arrangement may be provided in which the trace 114 is connected in series to the diode circuits 110a-110d, and the diode circuits 110a-110d are connected in series to the trace 116. The circuits 110a-110d may be connected in parallel with respect to each other.

Each circuit 110a-110d is shown implemented as a diode circuit with a respective pair of the diodes 112a-112h. In various embodiments, the circuit 110a may include the diodes 112a and 112b. The circuit 110b may include the diodes 112c and 112d. The circuit 110c may include the diodes 112e and 112f. The circuit 110d may include the diodes 112g and 112h. Other numbers (or amounts) of the diode circuits 110a-110d may be implemented to meet the design criteria of a particular application. Other numbers (or amounts) of diodes within each diode circuit 110a-110d may be implemented to meet the design criteria of a particular application.

The diodes in each circuit 110a-110d may be arranged in an anti-parallel format. For example, the cathode of the diode 112a may be connected to the anode of the diode 112b. The cathode of the diode 112b may be connected to the anode of the diode 112a. Similar connections may be made between the diode pairs 112c-112d, 112e-112f and 112g-112h.

Figure 4:
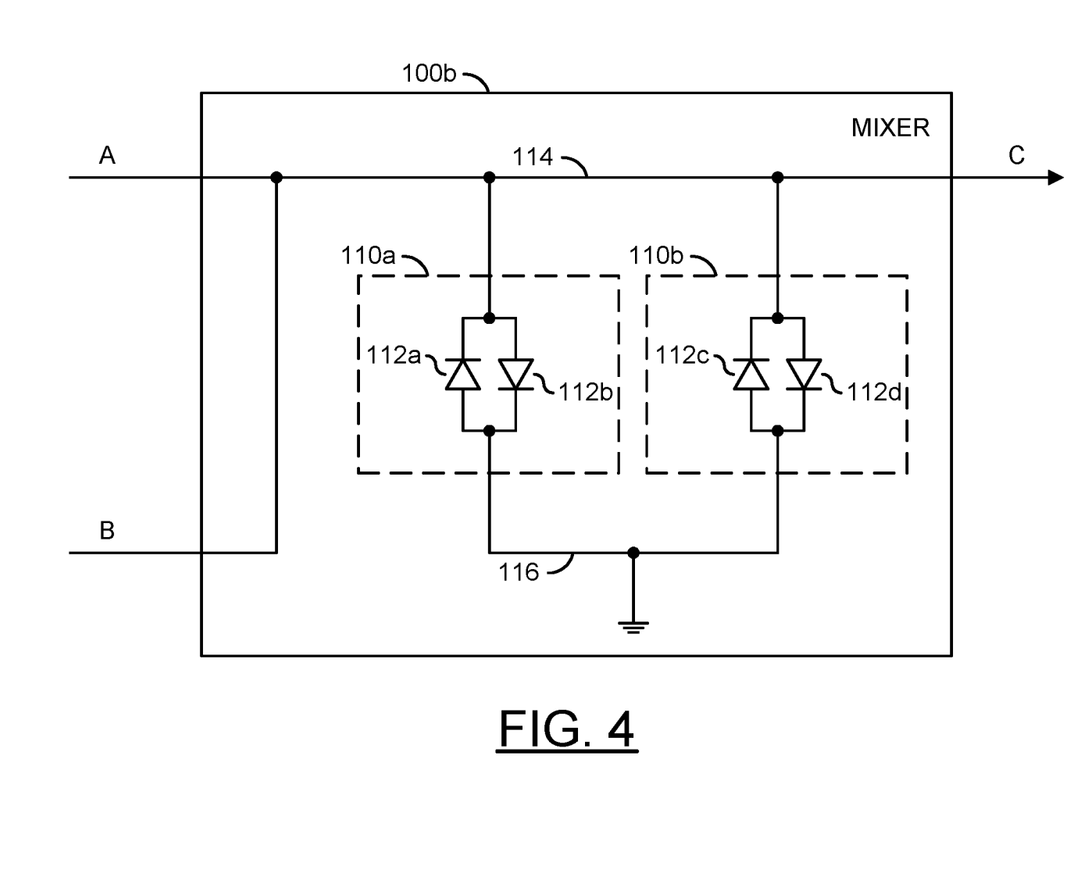
FIG. 4 is a block diagram of a shunt mixer circuit.

Referring to FIG. 4, a block diagram of an example implementation of a shunt mixer circuit 100b is shown. The mixer circuit 100 may be implemented with the shunt mixer circuit 100b. The circuit 100b generally comprises the diode circuits 110a-110b. The trace 114 may connect an end of each diode circuit 110a-110b. The trace 116 may connect another end of each diode circuit 110a-100b opposite the trace 114. In various embodiments, additional anti-parallel diode circuits may be incorporated in the shunt mixer circuit 110b as illustrated in the series mixer circuit 100a as shown in FIG. 3.

The signal A may be received on the trace 114. The signal B may be received on the trace 114. The signal C may be generated and presented from the trace 114. The trace 116 may be connected to a signal ground. A shunt arrangement may be provided by the diode circuits 110a-110b that shunt the trace 114 to ground through the trace 116. The diode circuits 110a-110b may be connected in parallel with respect to each other.

Figure 5:
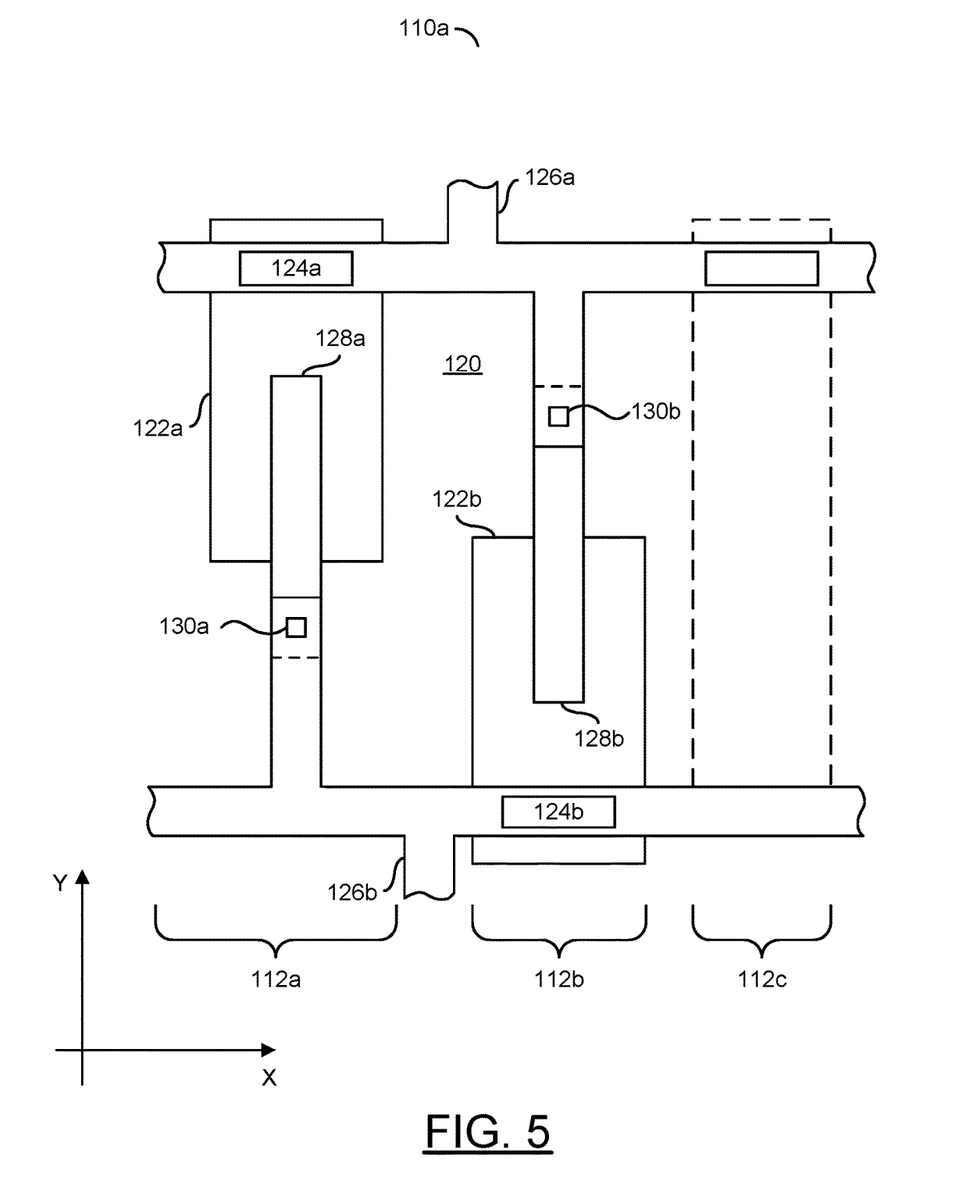
FIG. 5 is a layout of a mixer circuit in accordance with a preferred embodiment of the present invention.

Referring to FIG. 5, a layout of an example arrangement of the diode circuit 110a is shown in accordance with a preferred embodiment of the present invention. A layout of the other diode circuits 110b-110d may be similar to that of diode circuit 110a. The diode circuit 110a, and the other diode circuits 110b-110d, may be fabricated in a substrate 120 comprising one or more semiconductors. A layout of the diode circuit 110a generally places the diodes 112a-112b immediately adjacent to each other.

An advantage of the layout illustrated in FIG. 5 may be a thermal balancing between the diodes 112a-112b. A change in temperature in the diode 112a is generally associated with a similar change in temperature in the other diode 112b. Other advantages of the close neighboring layout may include, but are not limited to, signal balancing between the diodes 112a-112b, process similarities between the diodes 112a-112b and/or progressive dimensional variations across the substrate 120.

In some embodiments, the diode circuit 110a may be fabricated in single-element semiconductor, such as silicon. In various embodiments, the circuit 110a may be fabricated in III-V compounds. The III-V compounds may include, but are not limited to, Gallium Arsenide (e.g., GaAs), Indium Phosphide (e.g., InP), etc. In various embodiments, three-compound semiconductors may be used to implement the diode circuit 110a. The three-compound semiconductors may include, but are not limited to Aluminum Gallium Arsenide, etc. In some embodiments, the diode circuit 110a may be fabricated in a Silicon Germanium (e.g., SiGe) compound. In other embodiments, the circuit 110a may be fabricated in a Gallium Nitride (e.g., GaN) compound. Other materials may be used to create the diode circuit 110a to meet the design criteria of a particular application.

A pair of diffusions 122a-122b may be formed in a semiconductor substrate 120, a respective diffusion for each diode 112a-112b. The diffusions 122a and 122b may be adjacent to each other along an axis (e.g., an X axis). An ohmic contact 124a may be created between the diffusion 122a and a trace 126a. An ohmic contact 124b may be created between the diffusion 122b and a trace 126b.

A conductive region 128a may overlap and contact the diffusion 122a. The contacting overlap area generally forms a diode junction between the conductive region 128a and the diffusion 122a. A conductive region 128b may overlap and contact the diffusion 122b. The contacting overlap area generally forms a diode junction between the conductive region 128b and the diffusion 122b. The conductive regions 128a-128b may be spaced from the respective ohmic contacts 124a-124b along another axis (e.g., Y axis).

An ohmic contact 130a may optionally connect the conductive region 128a to the trace 126b. An ohmic contact 130b may optionally connect the conductive region 128b to the trace 126a. In various embodiments, the conductive regions 128a-128b may be metal so the diode junctions may be Schottky diode junctions and the ohmic contacts 130a and 130b may be eliminated. In some embodiments, the conductive regions 128a-128b may be a semiconductor so the diode junctions may be PN diode junctions. Other types of diode junctions may be implemented to meet the criteria of a particular application. In various embodiments, the trace 126a may be directly connected to the trace 114 and the trace 126b may be directly connected to the trace 116.

Layouts for the mixer circuits 100, 100a and/or 100b generally organize the diode circuits 110a-110d immediately adjacent to each other along the X axis. In various embodiments, the diode circuit 110b may be placed next to the diode circuit 110a (to the right of the diode circuit 110a in FIG. 5) and oriented such that the diode 112c has the same physical orientation along the Y axis as the diode 112a and is next to the diodes 112b along the X axis. Likewise, the diode circuit 110c may be positioned next to the diode circuit 110b such that the diode 112e has the same orientation as the diodes 112a and 112c, and is next to the diode 112d. The pattern may continue for the layout of additional diode circuits 110a-110d. Once all of the diode circuits 110a-110d have been placed, every other diode 112a, 112c, . . . , 112g may be oriented physically and electrically in one direction while the other diodes 112b, 112d, . . . , 112h are oriented physically and electrically in an opposite direction.

In various embodiments, the diodes 112a-112d may be arranged in parallel and anti-parallel with respect to each other. The parallel/anti-parallel arrangement may be suited to electron beam lithography on semiconductor systems (e.g., Gallium Arsenide). In other embodiments, the diodes 112a-112d may be arranged orthogonally and anti-parallel with respect to each other. The orthogonal/anti-parallel arrangements may be suitable for optical lithography on other semiconductor systems (e.g., Silicon, Silicon Germanium or Gallium Nitride).

Figure 6:
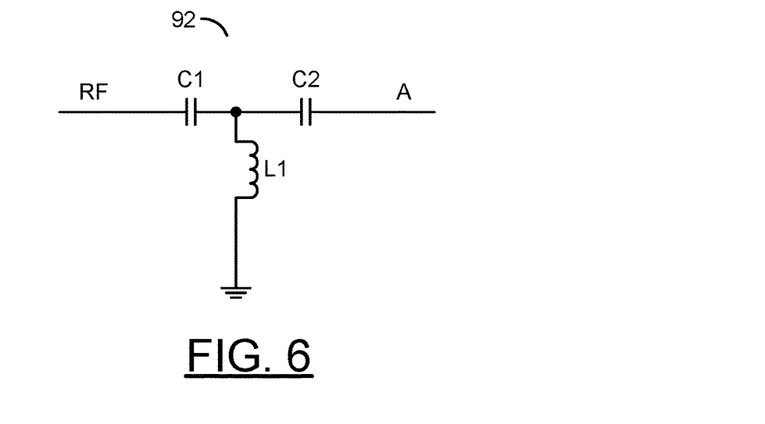
FIG. 6 is a schematic of a high-pass filter circuit.

Referring to FIG. 6, a schematic of an example implementation of the HPF circuit 92 as implemented in the circuit 90 is shown. The HPF circuit 92 generally comprises multiple capacitors C1-C2 and an inductor L1 arranged in a tee-configuration. The capacitors C1 and C2 may be connected in series. The capacitor C1 may have an end configured to receive the signal RF. The capacitor C2 may have an end configured to present the signal A. The inductor L1 may be connected between the signal ground and a junction that connects the capacitors C1 and C2.

Figure 7:
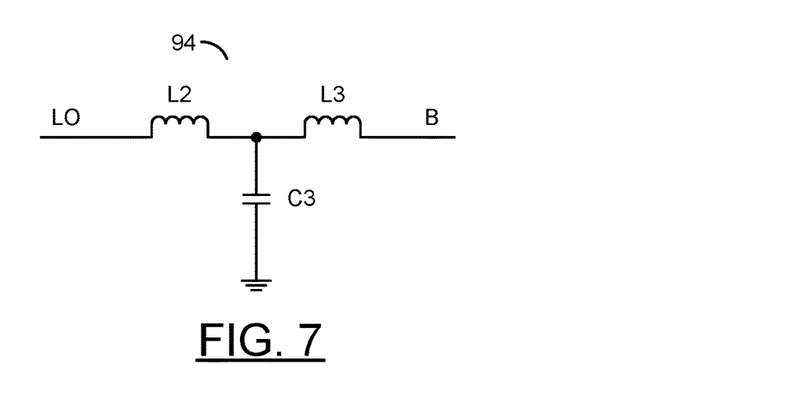
FIG. 7 is a schematic of a band-pass filter circuit.

Referring to FIG. 7, a schematic of an example implementation of the BPF circuit 94 as implemented in the circuit 90 is shown. The BPF circuit 94 generally comprises a capacitor C3 and multiple inductors L2-L3 arranged in a tee-configuration. The signal LO may be received by an end of the inductor L2. An end of the inductor L3 may present the signal B. The capacitor C3 may connect a junction that connects the inductors L2 and L3 to the signal ground.

Figure 8:
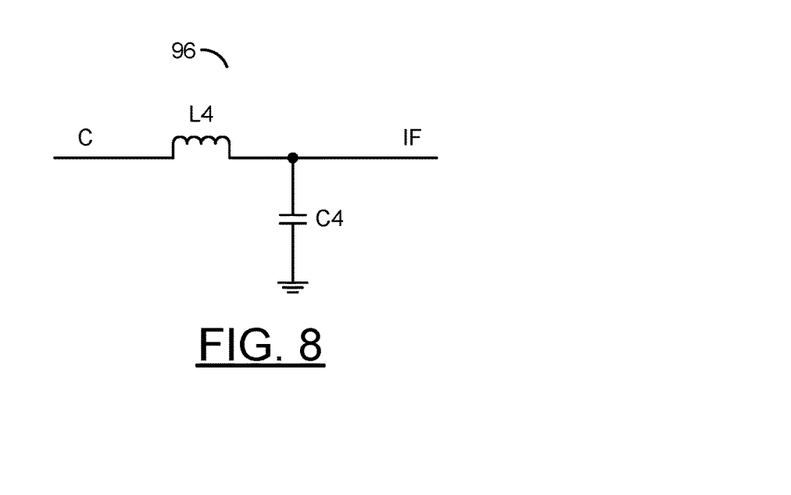
FIG. 8 is a schematic of a low-pass filter circuit.

Referring to FIG. 8, a schematic of an example implementation of the LPF circuit 96 as implemented in the circuit 90 is shown. The LPF circuit 96 generally comprises a capacitor C4 and an inductors L4 arranged in an L-configuration. The inductor L4 may have an end configured to receive the signal C. The inductor L4 may have another end configured to present the signal IF. The capacitor C4 may be connected between the signal ground and the signal IF.

Figure 9:
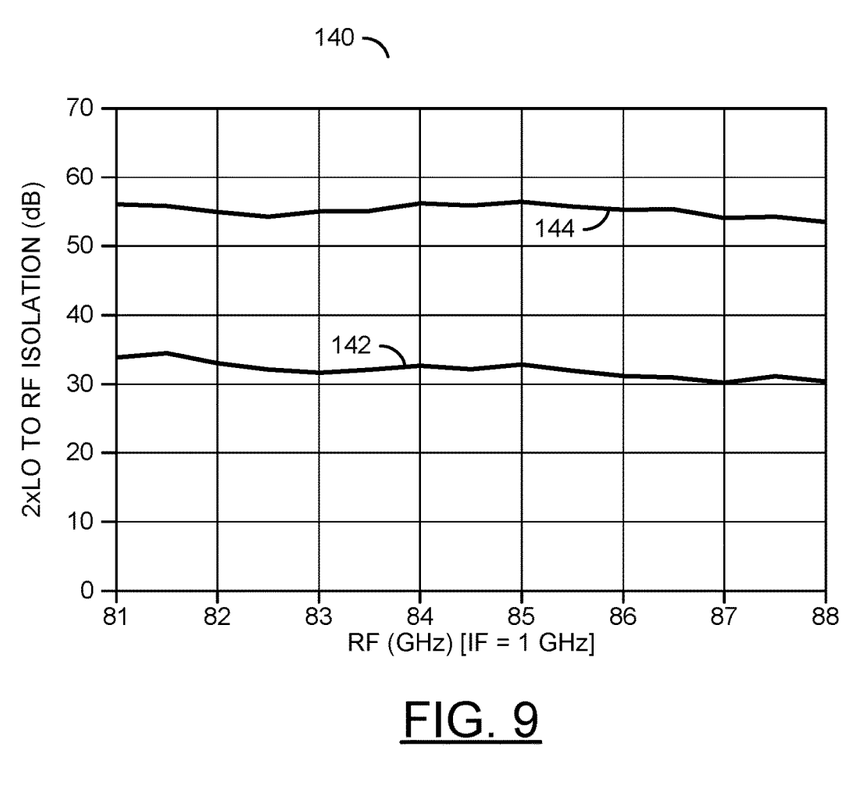
FIG. 9 is a graph of measured isolation of a radio frequency signal from a second-order harmonic in a local oscillator signal as a function of frequency.

Referring to FIG. 9, a graph 160 of measured isolation of the signal RF from a second-order harmonic in the signal LO as a function of frequency in the signal RF compared with a common diode structure is shown. The isolation is generally expressed in decibels in a range from zero dB to 70 dB. The frequency of the signal RF is generally illustrated over the range from 81 GHz to 88 GHz. The signal IF may be set at 1 GHz.

A curve 162 generally illustrates the isolation in the common series mixer having two sets of diodes. A curve 164 generally illustrates the isolation in the series mixer circuit 100a implemented with two circuits 110a-110b. The measurements generally show that the use of the alternating anti-parallel diodes 112a-112d in the circuit 110a-110b may have approximately a 20 dB to 25 dB higher isolation than the common mixer circuit. The higher isolation is generally sufficient to meet the −55 dB isolation criteria.

Figure 10:
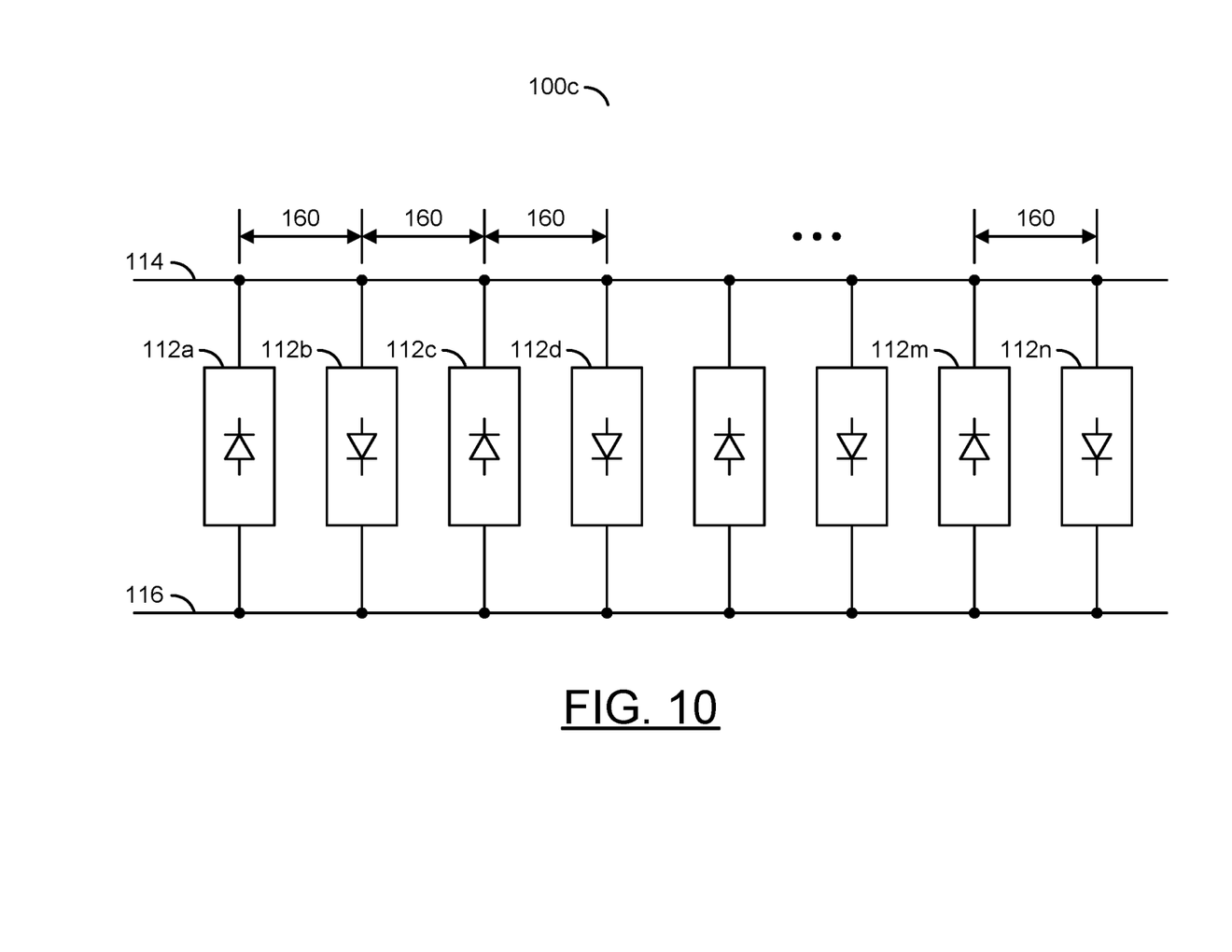
FIG. 10 is a diagram of a uniform mixer circuit.

Referring to FIG. 10, a diagram of an example implementation of a uniform mixer circuit 100c is shown. The mixer circuit 100c generally comprises the diodes 112a-112n. The trace 114 may connect an end of each diode 112a-112n. The trace 116 may connect another end of each diode 112a-112n opposite the trace 114. In various embodiments, other numbers of diodes may be implemented in the circuit 100c to meet the design criteria of a particular application. The mixer circuit 100c may be a variation of the mixer circuits 100a and/or 100b.

The diodes 112a-112n may be arranged in the anti-parallel format with the cathodes and the anodes (e.g., polarities) of every other diode being reversed relative to the neighboring diodes 112a-112n. A spacing 160 between neighboring diodes may be uniform (or constant). For example, the spacing 160 between the diodes 112b and 112c may match the spacing 160 between the diodes 112a and 112b. The spacing 160 between the diodes 112c and 112d may match the spacing 160 between the diodes 112a and 112b and the spacing 160 between the diodes 112b and 112c. The spacing 160 between the diodes 112m and 112n may match the spacing 160 between the diodes 112a and 112b, and so on.

Figure 11:
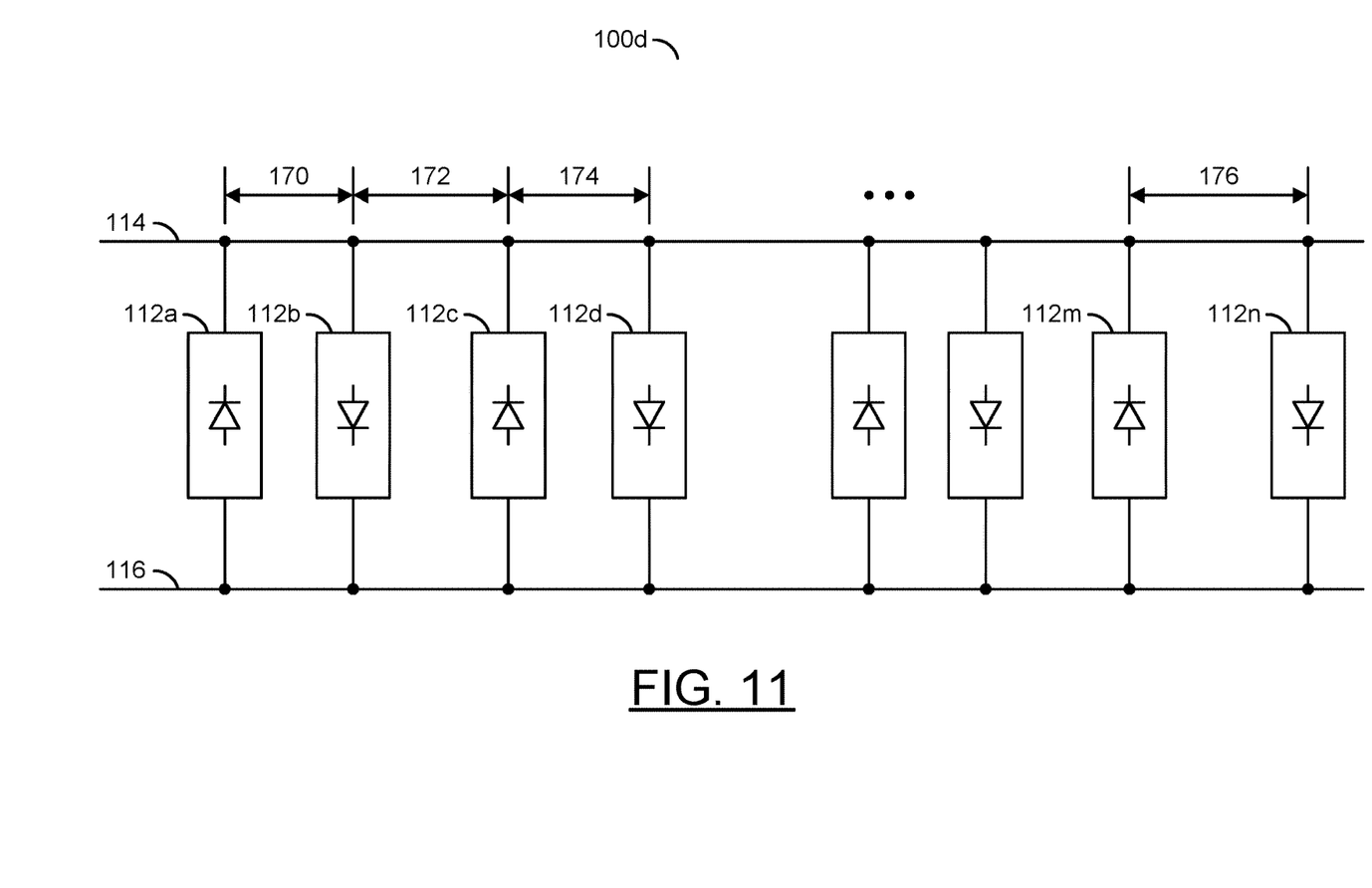
FIG. 11 is a diagram of a non-uniform mixer circuit.

Referring to FIG. 11, a diagram of an example implementation of a non-uniform mixer circuit 100d is shown. The mixer circuit 100d generally comprises the diodes 112a-112n. The trace 114 may connect an end of each diode 112a-112n. The trace 116 may connect another end of each diode 112a-112n opposite the trace 114. In various embodiments, other numbers of diodes may be implemented in the circuit 100d to meet the design criteria of a particular application. The mixer circuit 100d may be a variation of the mixer circuits 100a, 100b and/or 100c.

The diodes 112a-112n may be arranged in the anti-parallel format with the cathodes and the anodes (e.g., polarities) of every other diode being reversed relative to the neighboring diodes 112a-112n. Spacings 170-176 between neighboring diodes may also be non-uniform (or random). For example, the spacing 172 between the diodes 112b and 112c may be different than the spacing 170 between the diodes 112a and 112b (e.g., 170≠172). The spacing 174 between the diodes 112c and 112d may be different than the spacing 170 between the diodes 112a and 112b and the spacing 172 between the diodes 112b and 112c (e.g., 170≠172≠174), and so on.

Figure 12:
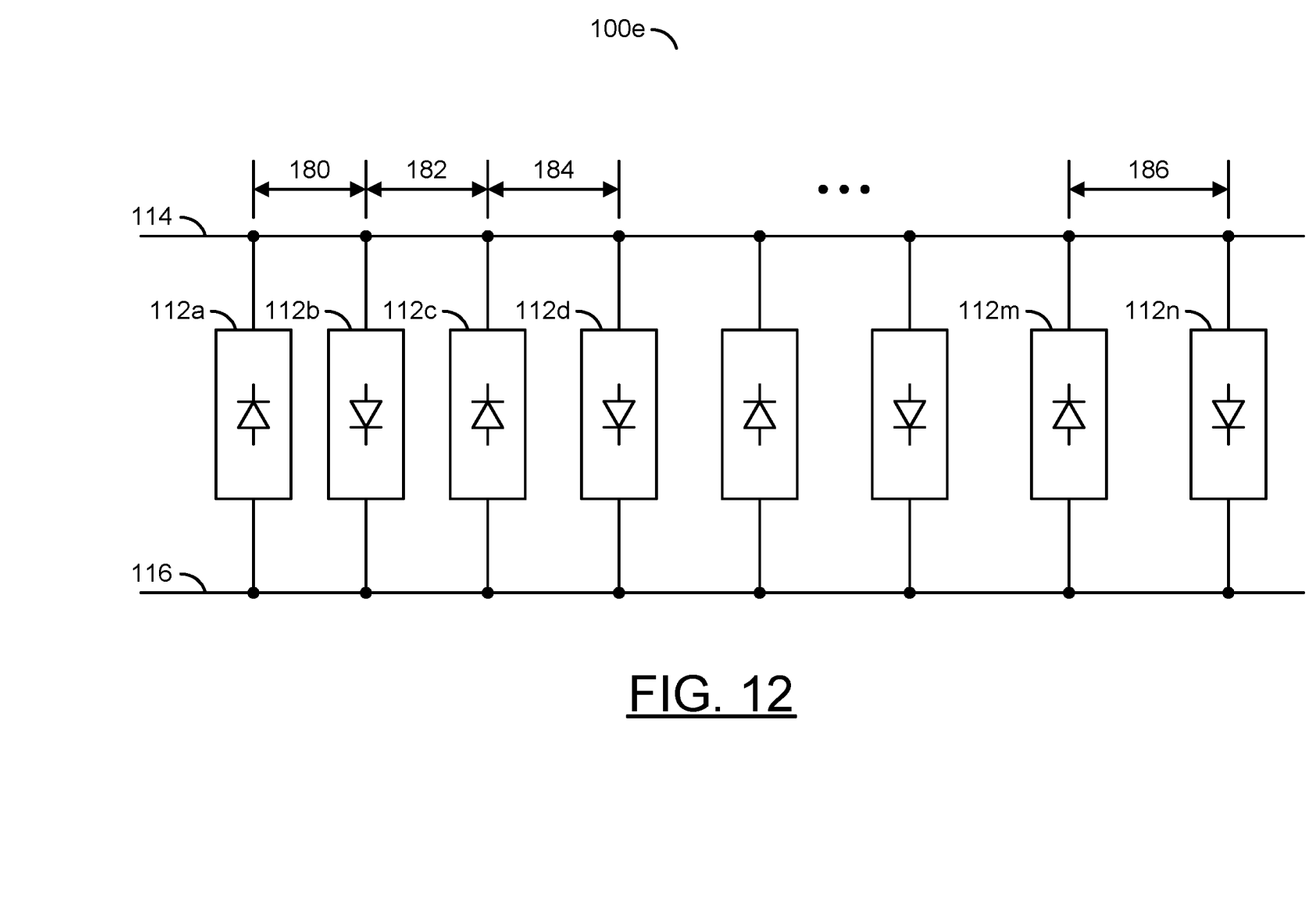
FIG. 12 is a diagram of a tapered mixer circuit.

Referring to FIG. 12, a diagram of an example implementation of a tapered mixer circuit 100e is shown. The mixer circuit 100e generally comprises the diodes 112a-112n. The trace 114 may connect an end of each diode 112a-112n. The trace 116 may connect another end of each diode 112a-112n opposite the trace 114. In some embodiments, other numbers of diodes may be implemented in the circuit 100e to meet the design criteria of a particular application. The mixer circuit 100e may be a variation of the mixer circuits 100a, 100b, 100c and/or 100d.

The diodes 112a-112n may be arranged in the anti-parallel format with the cathodes and the anodes (e.g., polarities) of every other diode being reversed relative to the neighboring diodes 112a-112n. Spacings 180-186 between neighboring diodes may be tapered. For example, the spacing 182 between the diodes 112b and 112c may be greater than the spacing 180 between the diodes 112a and 112b (e.g., 180<182). The spacing 184 between the diodes 112c and 112d may be greater than the spacing 182 between the diodes 112c and 112d (e.g., 180<182<184), and so on.

Figure 13:
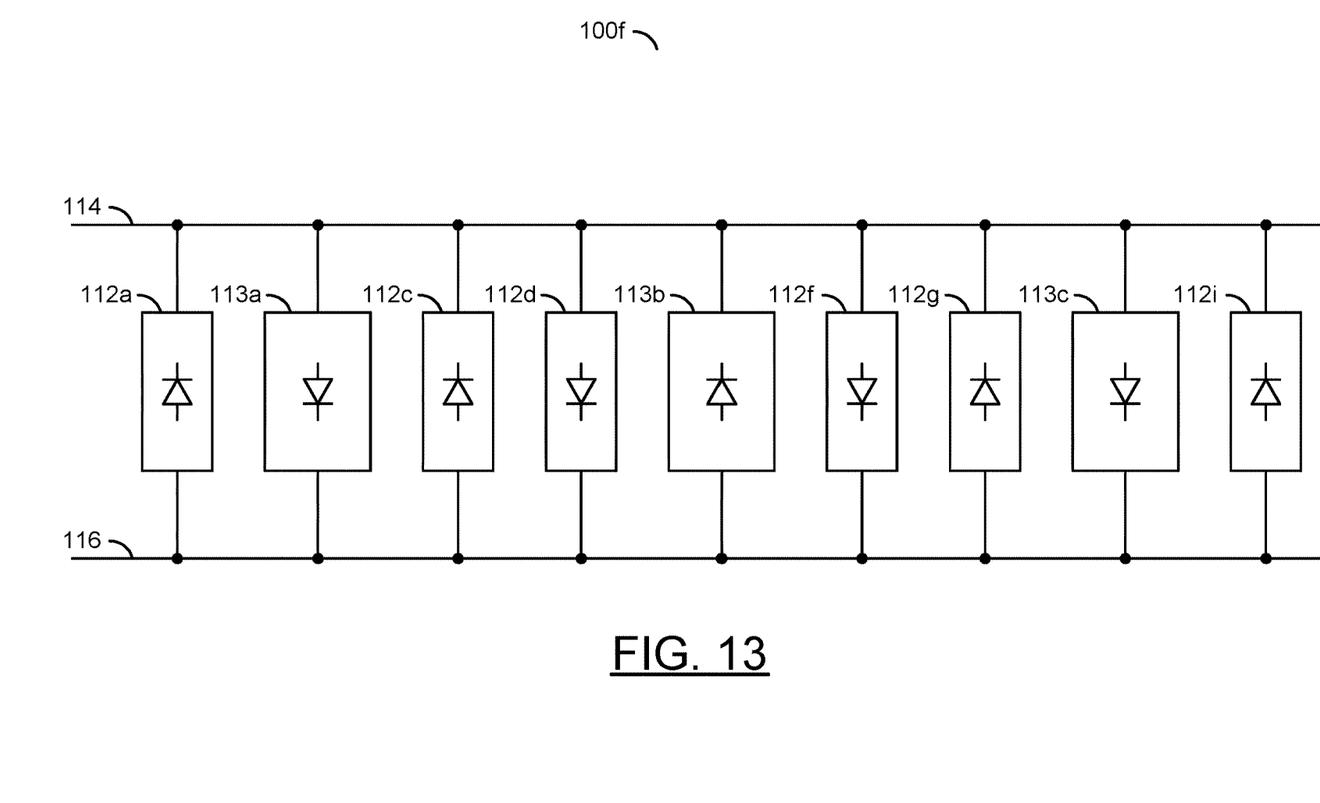
FIG. 13 is a diagram of an odd-numbered diode mixer circuit.

Referring to FIG. 13, a diagram of an example implementation of an odd-numbered diode mixer circuit 100f is shown. The mixer circuit 100f generally comprises the diodes 112a, 113a, 112c, 112d, 113b, 112f, 112g, 113c and 112i. The trace 114 may connect an end of each diode 112a, 113a, 112c, 112d, 113b, 112f, 112g, 113c and 112i. The trace 116 may connect another end of each diode 112a, 113a, 112c, 112d, 113b, 112f, 112g, 113c and 112i opposite the trace 114. In various embodiments, other numbers of diodes may be implemented in the circuit 100f to meet the design criteria of a particular application. The mixer circuit 100f may be a variation of the mixer circuits 100a, 100b, 100c, 100d and/or 100e.

The diodes 112a, 113a, 112c, 112d, 113b, 112f, 112g, 113c and 112i may be arranged in the anti-parallel format with the cathodes and the anodes (e.g., polarities) of every other diode being reversed relative to the neighboring diodes 112a, 113a, 112c, 112d, 113b, 112f, 112g, 113c and 112i. A total number of the diodes 112a, 113a, 112c, 112d, 113b, 112f, 112g, 113c and 112i (e.g., 9 diodes as illustrated) may be an odd number. To maintain a consistent current path between the traces 114 and 116, as viewed in each direction, two or more different sizes of diodes may be implemented. As illustrated, the diodes 113a-113c may be twice the size of the diodes 112a-112i. For example, each diode 112a-112i may have a size of one unit and each diode 113a-113c may have a size of two units. Current generally flows from the trace 114 to the trace 116 through a total diode size of 6 units. Current may flow in the other direction from the trace 116 to the trace 114 also through a total diode size of 6 units. The use of different diodes sizes may be matched to achieve symmetry in both polarities.

Figure 14:
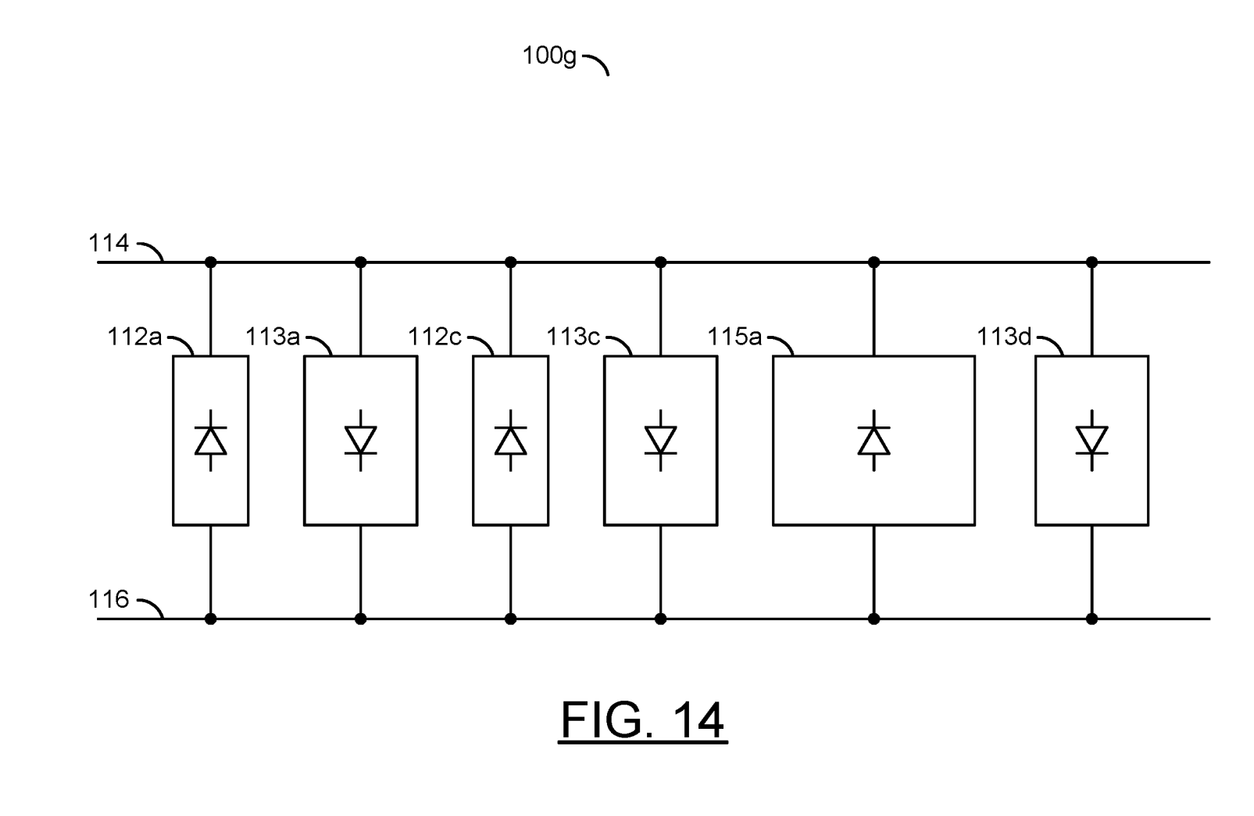
FIG. 14 is a diagram of an even-numbered diode mixer circuit.

Referring to FIG. 14, a diagram of an example implementation of an even-numbered diode mixer circuit 100g is shown. The mixer circuit 100g generally comprises the diodes 112a, 113a, 112c, 113c, 115a and 113d. The trace 114 may connect an end of each diode 112a, 113a, 112c, 113c, 115a and 113d. The trace 116 may connect another end of each diode 112a, 113a, 112c, 113c, 115a and 113d opposite the trace 114. In some embodiments, other numbers of diodes may be implemented in the circuit 100g to meet the design criteria of a particular application. The mixer circuit 100g may be a variation of the mixer circuits 100a, 100b, 100c, 100d, 100e and/or 100f.

The diodes 112a, 113a, 112c, 113c, 115a and 113d may be arranged in the anti-parallel format with the cathodes and the anodes (e.g., polarities) of every other diode being reversed relative to the neighboring diodes 112a, 113a, 112c, 113c, 115a and 113d. A total number of the diodes 112a, 113a, 112c, 113c, 115a and 113d (e.g., 6 diodes as illustrated) may be an even number. To maintain a consistent current path between traces 114 and 116, as viewed in each direction, two or more (e.g., three) different sizes of diodes may be implemented. As illustrated, the diodes 113a and 113c may be twice the size of the diodes 112a and 112c, and the diode 115a may be four times the size of the diodes 112a and 112c. For example, each diode 112a and 112c may have a size of one unit, each diode 113a and 113c may have a size of two units, and the diode 115a may have a size of four units. Current generally flows from the trace 114 to the trace 116 through a total diode size of 6 units. Current may flow in the other direction from the trace 116 to the trace 114 through a total diode size of 6 units. The use of different diodes sizes may be matched to achieve symmetry in both polarities.

The functions and structures illustrated in the diagrams of FIGS. 1 to 8 and 10 to 14 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit in a semiconductor substrate and comprising a first diode and a second diode connected as anti-parallel diodes and physically adjacent to each other in said semiconductor substrate;
a second circuit in said semiconductor substrate and comprising a third diode and a fourth diode connected as anti-parallel diodes and physically adjacent to each other in said semiconductor substrate;
a first trace; and
a second trace, wherein
each of said first diode, said second diode, said third diode, and said fourth diode is connected between said first trace and said second trace,
said first circuit and said second circuit are configured to mix two input signals connected, respectively, to said first trace and to said second trace to generate an output signal,
said first diode, said second diode, said third diode, and said fourth diode are physically arranged next to each other with a non-uniform spacing along an axis such that each of a first spacing between said first diode and said second diode, a second spacing between said second diode and said third diode, and a third spacing between said third diode and said fourth diode in said semiconductor substrate is different than each other, and
a polarity of every other physically neighboring diode is reversed.

2. The apparatus according to claim 1, wherein said non-uniform spacing comprises a random spacing for each of said first spacing, said second spacing, and said third spacing.

3. The apparatus according to claim 1, wherein said non-uniform spacing comprises a tapered spacing among said first spacing, said second spacing, and said third spacing.

4. The apparatus according to claim 1, further comprising a fifth diode physically adjacent to said fourth diode in said semiconductor substrate, wherein a total number of said diodes in said semiconductor substrate is an odd number.

5. The apparatus according to claim 1, wherein at least two of said diodes are of at least two different sizes.

6. The apparatus according to claim 1, wherein at least three of said diodes are of at least three different sizes.

7. The apparatus according to claim 1, wherein (i) said two input signals comprise a radio frequency signal and a local oscillator signal and (ii) said output signal comprises an intermediate frequency signal.

8. The apparatus according to claim 1, wherein (i) said two input signals comprise an intermediate frequency signal and a local oscillator signal and (ii) said output signal comprises a radio frequency signal.

9. The apparatus according to claim 1, wherein (i) said first circuit and said second circuit are part of a sub-harmonic mixer and (ii) said output signal (OUT) is related to said two input signals (IN1 and IN2) as OUT=2×N× IN1±M×IN2, where N and M are harmonic integers.

10. An apparatus comprising:
a plurality of filter circuits configured to filter at least two input signals and an output signal; and
a mixer circuit in a semiconductor substrate and connected to said filter circuits, said mixer circuit comprising a plurality of diodes connected in parallel, and configured to mix said at least two input signals to generate said output signal, wherein
said plurality of diodes comprise a first diode, a second diode, a third diode, and a fourth diode physically arranged next to each other with a non-uniform spacing along an axis such that each of a first spacing between said first diode and said second diode, a second spacing between said second diode and said third diode, and a third spacing between said third diode and said fourth diode in said semiconductor substrate is different than each other, each of said first diode, said second diode, said third diode, and said fourth diode is connected between a first trace and a second trace, said at least two input signals are connected, respectively, to said first trace and to said second trace to generate said output signal, and a polarity of every other physically neighboring diode is reversed.

11. The apparatus according to claim 10, wherein said non-uniform spacing comprises a random spacing for each of said first spacing, said second spacing, and said third spacing.

12. The apparatus according to claim 10, wherein said non-uniform spacing comprises a tapered spacing among said first spacing, said second spacing, and said third spacing.

13. The apparatus according to claim 10, wherein a total number of said diodes is an odd number.

14. The apparatus according to claim 10, wherein at least two of said diodes are of at least two different sizes.

15. The apparatus according to claim 10, wherein at least three of said diodes are of at least three different sizes.

16. The apparatus according to claim 10, wherein (i) said at least two input signals comprise a radio frequency signal and a local oscillator signal and (ii) said output signal comprises an intermediate frequency signal.

17. The apparatus according to claim 10, wherein (i) said at least two input signals comprise an intermediate frequency signal and a local oscillator signal and (ii) said output signal comprises a radio frequency signal.

18. The apparatus according to claim 10, wherein said output signal (OUT) is related to said input signals (IN1 and IN2) as OUT=2×N×IN1±M×IN2, where N and M are harmonic integers.

* * * * *